United States Patent [19]

Pastor et al.

[11] 4,190,487
[45] Feb. 26, 1980

[54] REACTIVE ATMOSPHERE PROCESSING METHOD OF CRYSTAL GROWTH OF ALKALINE EARTH CHLORIDES

[75] Inventors: Ricardo C. Pastor, Manhattan Beach; Antonio C. Pastor, Santa Monica, both of Calif.

[73] Assignee: Hughes Aircraft Company, Culver City, Calif.

[21] Appl. No.: 879,551

[22] Filed: Feb. 21, 1978

Related U.S. Application Data

[63] Continuation of Ser. No. 645,151, Dec. 30, 1975, abandoned.

[51] Int. Cl.² ............... B01J 17/08; B01J 17/18; C01B 9/02
[52] U.S. Cl. ............... 156/617 SP; 156/619; 156/DIG. 78; 156/DIG. 80; 423/497

[58] Field of Search ......... 156/619, 617 SP, DIG. 78, 156/DIG. 80, DIG. 83; 423/490, 497

[56] References Cited

U.S. PATENT DOCUMENTS 3,826,817  7/1974  Pastor et al. ............... 156/DIG. 71
3,935,302  1/1976  Pastor et al. ............... 423/490

FOREIGN PATENT DOCUMENTS 1137582  12/1968  United Kingdom ............... 423/490

Primary Examiner—Joseph Scovronek
Assistant Examiner—Bradley Garris
Attorney, Agent, or Firm—Booker T. Hogan, Jr.; W. H. MacAllister

[57] ABSTRACT

Alkaline earth chloride crystals exhibiting substantially improved physical and optical transmission characteristics are grown from starting powders by a one step Reactive Atmospheric Processing (RAP) method.

11 Claims, No Drawings

REACTIVE ATMOSPHERE PROCESSING METHOD OF CRYSTAL GROWTH OF ALKALINE EARTH CHLORIDES

This is a continuation of application Ser. No. 645,151, filed Dec. 30, 1975, now abandoned.

RELATED APPLICATIONS

In U.S. Application Ser. No. 449,148, filed Mar. 7, 1974, now U.S. Pat. No. 3,959,442 by R. C. Pastor and Morton Robinson, an invention directed to the preparation of single crystal laser emission compounds, of the formula $ARF_4$, by a direct congruent melt crystal growth process, is disclosed.

In U.S. application Ser. No. 645,866, filed Dec. 29, 1975, now U.S. Pat. No. 4,076,574, by R. C. Pastor and A. C. Pastor, an invention directed to a method of growing large single crystals of alkali metal halides in a Reactive Atmosphere is disclosed.

The aforestated applications have each been assigned to the assignee herein, involve related subject matter, and to a large extent are the product of a commonality of inventors.

BACKGROUND OF THE INVENTION

1. Field of the Invention:

This invention is concerned with the preparation of large single crystals of alkaline earth halides and more particularly to the preparation of alkaline earth chloride single crystals.

2. Description of the Prior Art:

Alkaline earth chlorides are reported to be grown from the melt in a vacuum or inert atmosphere. The resulting crystals are highly hydrolyzed; i.e., they contain an $OH^-$ mole fraction $\geq 10^{-3}$ and exhibit a poor environmental stability which ranges from a hygroscopic behavior, as in the case of $BaCl_2$ and $SrCl_2$, to deliquesence, as in the case of $CaCl_2$.

These crystals are useful in the laser technology fields as laser window materials. They have utility in other optical applications requiring high optical transmission efficiencies and long term stability. However, their utility is limited by the afore-mentioned characteristics which we attribute to the presence of anion and cation impurities in the crystals in general and in particular to the presence of $OH^{31}$ impurities.

Stockbarger sought to remove $O^{-2}$ from $CaF_2$ melts by using $PbF_2$ as a scavenger in accordance with the following equation (D. C. Stockbarger, *J. Opt. Soc. Am.* 39, 731, 1949)

$$PbF_2(c) + O^{-2}(c) \rightleftharpoons 2F^-(c) + PbO(c) \qquad (1)$$

However, the process was defective in that excess $PbF_2$ and PbO was volatilized, residual amounts of the scavenger throttled the growth rate, and rehydrolysis of the $CaF_2$ melt occurred.

Applicants know of no prior art crystal growth processes which yield alkaline earth chloride crystals exhibiting ultra-low optical absorption characteristics and longer term environmental stability in a consistent manner that is suitable for large scale production operations.

THE INVENTION

SUMMARY

In seeking to produce large single crystals of alkaline earth chlorides suitable for laser and other optical transmission applications, it is an objective of this invention to provide a process for growing such crystals capable of yielding crystals which have ultra-low contaminants and no $OH^-$ traces. A further objective of this invention is to provide a crystal growth process that minimizes the material handling steps whereby opportunities for contamination during crystal growth are reduced. A still further objective of this invention is to provide a crystal growth process that is economically practical and suitable for large scale production of ultra-pure large single alkaline earth chloride crystals.

In meeting the above-stated objectives, we have developed a crystal growth process whereby large single crystals of alkaline earth chlorides are grown from the melt and subsequently cooled to room temperature in a "Reactive Atmosphere". This process utilizes an ion exchange mechanism to rid the starting materials and crystal growth environment of unwanted contaminants. Nascent halogens, produced by controlled pyrolytic decomposition of carbonaceous chlorides, react with the contaminants in a dynamic environment which precludes the establishment of conditions whereby the mole fraction of the contaminants is in equilibrium with that of the purified materials.

A key feature of the process lies in the production of nascent halogens under conditions which facilitate the purification of the starting materials, a conditioning of the crystal growth crucible, and allows for the growth and ultimate cooling of the crystals in a single reaction sequence. There are no intermediate operations which afford an opportunity for contamination of the product.

DETAILED DESCRIPTION OF THE INVENTION

Large single crystals of alkaline earth and other metal chlorides have been produced by crystal growth from solutions and from melts. In the latter case, the crystals are grown in ambient environments, inert environments, and in vacuum environments. Well known methods are employed such as that of Bridgman and Czochralski with steps taken to insure the purity of the starting materials and the growth environment. However, none of the methods recognized the importance of the heterogeneous reaction (hydrolysis) in crystal growth. This reaction may be expressed as:

$$X^-(c) + HOH(g) \rightleftharpoons OH^-(c) + HX(g), \qquad (2)$$

where $X^-$ represents a halide, (c) a condensed phase (crystal and/or melt), and (g) the gas phase. The relation of concentrations in (c) to the sources in (g) is:

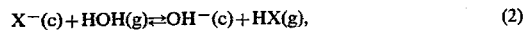

$$C = \frac{[OH^-(c)]}{[X^-(c)]} = K \frac{P(H_2O)}{P(HX)}, \qquad (3)$$

where K, the equilibrium constant of Equation 2, is fixed in the crystal growth of a material at its melting point. To achieve a low C and thereby obtain ultra-pure crystal growth, the ratio of $P(H_2O)/P(HX)$ must be low. We call this ratio the RAP index.

Our studies have shown that a low RAP index can be obtained by the pyrolytic breakdown of certain carbonaceous compounds to produce nascent halogens which getter $OH^-$ and other impurities. The pyrolysis breakdown must proceed unimolecularly with a decay constant (k) between $10^{-1}$ to approximately $10^{-2}$ sec$^{-1}$ at the melting point of the metal halide (for $MgCl_2$, $CaCl_2$, SrCl$_2$, and BaCl$_2$ these temperatures are 708° C., 772° C., 873° C., and 963° C., respectively).

To achieve a one step Reactive Atmospheric Processing (RAP) growth of a crystal, the surface of the crystal growth crucible (usually quartz) must also be conditioned to remove impurities. This conditioning is also achieved by scrubbing the crucible with nascent halogens produced by the pyrolytic breakdown of the RX compounds while raising the crucible temperature to $\approx 800°$ C. This is easily accommodated in the process with negligible volatility loss of the alkaline earth chloride because of its high boiling point: MgCl$_2$, 1412° C.; CaCl$_2$, >1600° C.; SrCl$_2$, 1250° C.; and BaCl$_2$, 1560° C.

A detailed explanation of the pyrolytic breakdown mechanism and the competing paths in which the breakdown may occur is presented in U.S. application Ser. No. 645,866, filed Dec. 29, 1975, now U.S. Pat. No. 4,076,574, and "Crystal Growth in a Reactive Atmosphere," by Pastor and Pastor, *Mat. Res. Bull.*, Vol. 10, pp. 117-124, 1975. The discussion therein relates to the generation of nascent halogens for crystal growth of alkali metal halides. However, the principles disclosed are equally applicable to the growth of alkaline earth halides. From the referenced disclosures, one need only match the appropriate RAP agent to the working temperature of the alkaline earth metal halide sought to be produced.

Since the number of possible candidate RAP agents is large, a list of agents applicable for growing alkaline earth chlorides is presented in Table I. The list of agents shown is not intended to be all inclusive. Other materials of a similar character may work. It should be noted that a successful crystal growth process depends upon the production of nascent halogens at a reliable, reproducible rate. The incidental, inadvertent production of a nascent halogen which accompanies the exposure of a carbonaceous halide to an elevated temperature will not result in a reliable, economic RAP process unless steps are taken to minimize the conversion of the nascent halogen to its molecular form. RAP agents must be selected such that their pyrolytic decay constants are preferably between $10^{-2}$ and $10^{-1}$ sec$^{-1}$ at the melting point of the metal chloride being grown. The selection of these agents is facilitated by reference to standard tables of C-X bond vibration frequencies and dissociation energies.

In practice, the process may be described as entailing the placing of an alkaline earth chloride powder into a crystal growth crucible outfitted with a means for raising the temperature of the powder above its melting point and a means for passing carbonaceous halide gases through the crucible at a controlled rate. The temperature of the crucible is raised to a level sufficient to transform the powdered metal halide into a melt. While molten, the metals halide and the interior surfaces of the crucible are purged of impurities by nascent halogens formed from the pyrolytic breakdown of carbonaceous gases, carried into the crucible by an inert or reactive carrier gas. This purification purge usually requires from 25 to 50 hours. An analysis of the exit gas effluent for free halogen and the hydrogen halide is used to ascertain when crystal growth should be initiated.

Crystal growth is initiated by creating a temperature gradient across the crucible by the introduction of a coolant at one end. During crystal growth, a halogen source gas (carrier gas included) flow rate of 0.5 to 1.0 milliliters/sec. is maintained. Pull rates of from 4 mm/hr to 2 mm/hr are employed.

After crystal growth has been completed, the halogen purge is maintained while the crystal is allowed to cool to ambient temperature.

EXAMPLE 400 g of BaCl$_2$ powder of analytical grade is weighed and transferred into a crystal growth crucible. A cylinder of gas containing 1-2 mole % CF$_3$Cl is connected through teflon plumbing to the inlet of the crucible which is also fitted with an outlet leading to a scrubber. The temperature of the crucible is raised to 1000° C. at which point the BaCl$_2$ powder becomes molten. The flow of the RAP mixture is maintained at 1 ml./sec. through the whole process.

This process consists of a preliminary scrubbing of the molten charge and interior surfaces of the crucible, followed by the crystal growth operation with a pull rate of 4 mm/hr., until the entire crystal is outside of the hot zone of the furnace. The vaporous phase about the crystal is still in the hot zone and remains chemically reactive.

The furnace temperature is allowed to drop linearly to 200° C. within a four hour period. Subsequently, the crystal is allowed to cool to room temperature and removed from the crucible.

BaCl$_2$ crystals, prepared in accordance with the above procedure, exhibit a higher environmental stability than crystals prepared by prior art processes and do not show the solid-solid transition behavior characteristics of crystals prepared by prior art processes.

The above process is applicable to SrCl$_2$ and BaCl$_2$ when the temperatures are adjusted to match the respective melting points of the materials.

TABLE I

| RAP-AGENTS for ALKALINE EARTH CHLORIDE Single Crystal Growth | | |
|---|---|---|
| Alkaline Earth Chloride | RAP Agent | Pyrolytic Decay Constant, k sec$^{-1}$ |
| BaCl$_2$ | CF$_3$Cl | 0.044 |
|  | CH$_3$Cl | 0.12 |
|  | CH$_3$Cl/CF$_3$Cl$^{(1)}$ | 0.050 |
| SrCl$_2$ | CH$_2$Cl$_2$ | 0.21 |
|  | CH$_3$Cl | 0.009 |
|  | CH$_2$Cl$_2$/CH$_3$Cl$^{(2)}$ | 0.050 |
| CaCl$_2$ | CCl$_4$ | 0.13 |
|  | CH$_2$Cl$_2$ | 0.009 |
|  | CCl$_4$/CH$_2$Cl$_2$$^{(3)}$ | 0.050 |
| MgCl$_2$ | CCl$_4$ | 0.015 |
|  | C$_6$H$_5$CH$_2$Cl | 0.74 |
|  | CHCl$_3$ | 0.032 |
|  | C$_6$H$_5$CH$_2$Cl/CHCl$_3$$^{(4)}$ | 0.050 |
|  | C$_6$H$_5$CH$_2$Cl/CCl$_4$$^{(5)}$ | 0.050 |

$^{(1)}$Molar proportion = 1:12.
$^{(2)}$Molar proportion = 1:4
$^{(3)}$Molar proportion = 1:2
$^{(4)}$Molar proportion = 1:39
$^{(5)}$Molar proportion = 1:20

What we claim is:

1. A process for growing ultra-pure large single crystals of alkaline earth metal chlorides comprising the steps of:
   (a) charging a crystal growth crucible with an alkaline earth metal chloride,
   (b) raising the temperature of said crucible to render said charge molten by placing said crucible in a furnace,
   (c) passing a mixture of an inert carrier gas and vapors from a carbonaceous chloride selected from the group consisting of CF$_3$Cl, CH$_3$Cl, CH$_2$Cl$_2$, C$_6$H$_5$CH$_2$Cl, and mixtures thereof having a pyrolytic decay constant between $0.9 \times 10^{-2}$ and $10^{-1}$ seconds$^{-1}$ at the melting point of said metal chloride through said crucible at a preselected flow rate, and thereby causing a reactive atmosphere containing nascent chlorine to be created, (d) creating a temperature gradient across said crucible by passing a coolant through one end of said crucible thereby lowering the temperature of said charge and initiating a recrystallization of said molten charge, (e) slowly pulling a single crystal from said molten melt in Bridgman-Stockbarger style until all of said crystal has been removed from the hot zone of said furnace, and (f) maintaining a steady purge of said gaseous mixture over said crystal while causing said crystal to cool from its recrystallization temperature at a preselected cooling rate for a period of four hours prior to allowing said crystal to cool to ambient temperatures in the presence of said gaseous purge.

2. The process of claim 1 wherein said alkaline earth metal chloride is $BaCl_2$, said carrier gas is helium, said carbonaceous chloride is $CF_3Cl$, and said gaseous mixture is passed through said crucible for a period ranging from 25 to 50 hours prior to the introduction of said coolant into said crucible and thereby initiating said crystal growth.

3. The process of claim 1 wherein said alkaline earth metal chloride is $SrCl_2$, said carbonaceous chloride is $CH_2Cl_2$, and said inert gas is helium.

4. The process of claim 1 wherein said alkaline earth metal chloride is $CaCl_2$ and said carrier gas is helium.

5. The process of claim 1 wherein said chloride crystals are formed from the group of alkaline earth chlorides consisting of $BaCl_2$, $MgCl_2$, $CaCl_2$ and $SrCl_2$.

6. The process of claim 5 wherein said inert carrier gas is taken from the group of gases consisting of nitrogen, helium, nitrous oxide, and argon.

7. An improved process for growing ultra-pure large single crystals of alkaline earth metal chlorides from the melt in Bridgman-Stockbarger style, the improvement comprising:

(a) exposing a melt of an alkaline earth metal chloride powder to a dynamic reactive gaseous mixture comprised of an inert gas carrier and vapors obtained from the pyrolytic decomposition of carbonaceous chlorides selected from the group consisting of $CF_3Cl$, $CH_3Cl$, $CH_2Cl_2$, $C_6H_5CH_2Cl$ and mixtures thereof having a decay constant of from $0.9 \times 10^{-2}$ to $10^{-1}$ seconds$^{-1}$ at the melting point of said metal chloride powder so as to create a reactive atmosphere containing nascent chlorine;

(b) maintaining said exposure to said mixture at a gaseous flow rate of up to 1.0 milliliter per second for a period of from 25 to 50 hours, (c) initiating the recrystallization of said melt in the presence of said gasses by lowering the temperature at one end of said melt and pulling a single crystal from said melt by utilizing Bridgman-Stockbarger style pull rates of from 2 to 4 millimeters per hour in the presence of said gaseous mixture, and (d) allowing the temperature of said crystal to decrease from its recrystallization temperature to approximately 200° C. over a period of four hours in the presence of said reactive gaseous mixture prior to a subsequent gradual cooling of said crystal to ambient temperatures.

8. The process of claim 7 wherein said inert gas carrier is selected from the group of gases consisting of nitrogen, helium, nitrous oxide, and argon.

9. The process of claim 7 wherein said metal chloride is $BaCl_2$, said carrier gas is helium and said carbonaceous chloride is $CF_3Cl$.

10. The process of claim 7 wherein said metal chloride is $SrCl_2$, said carbonaceous chloride is $CH_2Cl_2$ and said inert gas is helium.

11. The process of claim 7 wherein said metal chloride is $CaCl_2$, and said carrier gas is helium.

* * * * *